United States Patent [19]

Neubacher et al.

[11] Patent Number: 5,801,126
[45] Date of Patent: Sep. 1, 1998

[54] PROCESS FOR PRORDUCING THALLIUM-CONTAINING HIGH-$T_c$-SUPERCONDUCTORS IN FLOWING GAS ATMOSPHERES

[75] Inventors: Marc Neubacher, Frankfurt; Steffen Elschner, Niedernhausen; Christoph Lang, Frankfurt; Christoph Teske, Flintbeck; Hans Karl Mueller-Buschbaum, Kiel, all of Germany

[73] Assignee: Hoechst Aktiengesellschaft, Frankkurt am Main, Germany

[21] Appl. No.: 612,844

[22] PCT Filed: Sep. 8, 1994

[86] PCT No.: PCT/EP94/03009

§ 371 Date: Sep. 17, 1996

§ 102(e) Date: Sep. 17, 1996

[87] PCT Pub. No.: WO95/08517

PCT Pub. Date: Mar. 30, 1995

[30] Foreign Application Priority Data

Sep. 21, 1993 [DE] Germany ............ 43 31 975.0

[51] Int. Cl.$^6$ ............ C04B 35/64; C04B 35/50
[52] U.S. Cl. ............ 505/501; 505/482; 505/492; 505/220

[58] Field of Search ............ 252/518, 521, 252/521.1; 505/120, 482, 492, 501, 742, 220; 423/155, 593; 419/32

[56] References Cited

FOREIGN PATENT DOCUMENTS 324660 7/1989 European Pat. Off. .

OTHER PUBLICATIONS

Goretta et al "Processing TlBa$_2$Ca$_3$Cu$_2$O$_y$ Powders" *Supercon, Science & Tech.*, vol. 5, No. 9, Aug. 1992 pp. 534–537.
Hervieu et al "A New Member of the Thillium Superconductive Series", The 1212 Oxide . . . *Journal of Solid state Chem.*, 75, pp. 212–215, 1988 (No Month).

*Primary Examiner*—Mark Kopec
*Attorney, Agent, or Firm*—Foley & Lardner

[57] ABSTRACT

The process for producing high-$T_c$ superconductors containing thallium, calcium, barium and copper, possibly also lead and/or strontium, provides for a thallium-free precursor to be produced in a first reaction step and this to be then mechanically triturated, subsequently heated to temperatures in the range from 700° to 950° C. and heat treated for a period of at least 3 hours. The mixture is then cooled to ambient temperature and ground again. Finally, it is heat treated at temperatures of from 400° to 500° C. in a stream of pure oxygen. The thallium-free precursor is then triturated with Tl$_2$O$_3$, if desired shaped into a shaped part and then oxidatively fired in a flowing gas atmosphere.

17 Claims, 1 Drawing Sheet

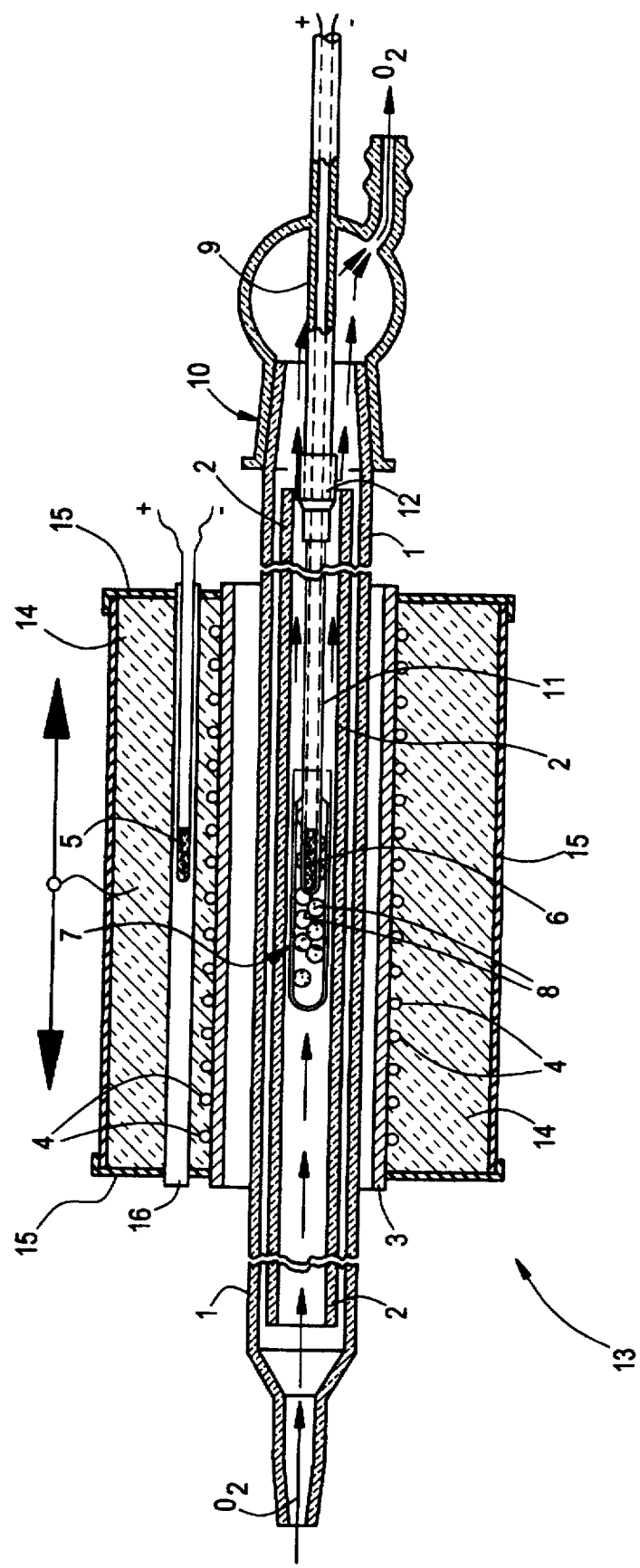

PROCESS FOR PRORDUCING THALLIUM-CONTAINING HIGH-$T_c$-SUPERCONDUCTORS IN FLOWING GAS ATMOSPHERES

The invention relates to a process for producing thallium-containing oxide-ceramic superconductors, by means of which massive ceramic components and also precursor materials for the "oxide powder in tube" method (OPIT) can be obtained.

It is already known that a plurality of high-$T_c$ superconducting oxide compounds are formed in the pseudoquaternary system $Tl_2O_3/CaO/BaO/CuO$. This is primarily dependent on the ratio of the metal oxides used in each case, on the temperatures used and on the oxygen partial pressure during firing. Unlike the case of the structurally related Bi compounds, in the case of thallium-containing superconductors there are two classes of compounds having the general, nominal compositions:

a) $Tl/PbCa_{n-1}Ba_2Cu_nO_x$ (low-thallium) and
b) $(Tl/Pb)_2Ca_{n-1}Ba_2Cu_nO_y$ (thallium-rich).

in the wide sense, a) includes the corresponding barium-free strontium compounds $Tl_{0.1}Pb_{0.5}Ca_{n-1}Sr_2Cu_nO_z$.

In the case a) the compounds having n=2 and n=3 and in the case b) those having n=1, 2 and 3 form superconductors having critical transition temperatures ($T_c$) above the boiling point of liquid nitrogen (T=77K). The discovery and characterization of these compounds is described, for example, by Z. Z. Sheng et al. in Nature, vol. 332, p. 55, (1988). The highest transition temperature $T_c$ known hitherto is 125K for the thallium-rich, lead-free compound of the type Tl-2223 from the above-mentioned series b). The transition temperatures for Tl-1223 from the series a) are in the range $118K<T_c<122K$. According to the studies of D. H. KIM et al., published in Physica C 177, p. 431, (1991), there is a clear relationship between the critical current density and the spacing of the so called CuO planes in the crystal structure, as a function of the details of the production method.

This is related to the melting behavior of the magnetic flux lattice, particularly in the superconductors built up of layers. In the case of the thallium-containing superconductors, the best magnetic coupling between the layers is observed in the case of the compounds of the abovementioned low-thallium series a) having n=2 and n=3 [see T. DOI et al., Physica C 183, p. 67, (1991)]. At a temperature of 77K and a magnetic field of 1 T, intragranular, critical currents of the order of $J_c=10^5$ A/cm² were able to measured [cf. R. S. LIU et al. in Appl. Phys. Lett. 60, p. 1019, (1992)]. The critical transport current densities are at present, owing to the grain boundary effects (weak links), still far below this value, namely in the region of a few 100 A/cm². For the above reasons, the Tl superconductors of the series a) (Tl-1223 and Tl-1122) are of greater practical importance for use in power applications in the temperature range above 77K. They are even superior to the bismuth-containing superconductor ceramics in this temperature range, because there only well characterized compounds analogous to series b), containing Bi in place of Tl and Sr in place of Ba, are known. These are compounds of the nominal composition $Bi_2CaSr_2Cu_2O_y$ (n=2, $T_c$=92K) and $Bi_2Ca_2Sr_2Cu_3O_x$ (n=3, $T_c$=110K) in which the spacing between the CuO planes is in principle greater than in the comparable thallium compounds of the series a).

A further, industrially significant compound is $YBa_2Cu_3O_7$ ($T_c$=92K). Although the spacing between the CuO planes is there even less than in the case of the thallium-containing superconductors, the grain boundary effects are significantly more pronounced for a comparable texture, which is apparent in a stronger magnetic field dependence of $J_c$.

The actual preparation of oxide ceramic superconductors is carried out by means of the solid state reaction at high temperatures. In the case of the thallium-containing superconductor ceramics, the properties achieved at low temperatures depend essentially on the ratio of the metal atoms weighed out in the starting mixture, the selection of the starting components themselves, the oxygen partial pressure of the surrounding gas atmosphere and finally on the temperatures used and the $Tl_2O$ vapor pressure during firing. The preparation of the $TlCa_2Ba_2Cu_3O_{8.5+x}$ super-conducting ceramic is described by K. C. Goretta et al. in Supercond. Sci. Technol. 5, p. 534, (1992). They are accordingly produced at high temperatures from pre-calcined mixtures containing the starting oxides in the desired metal ratio. This occurs finally in hermetically sealed containers (quartz ampoules) or using gold foils to avoid thallium losses at temperatures around 900° C., in an oxygen-containing atmosphere, with a partial melt being formed. The reaction time is 0.1 h with subsequent slow (3K/min) lowering of the temperature to 805° C. The preparation of phase-pure formulations is obviously made difficult. Additions of strontium and also of lead can improve the results [cf. S. P. Matsuda et al., Appl. Phys. Lett. 59, p. 3186, (1991)]. A disadvantage is that the contamination of the samples with $BaCuO_2$ can hardly be completely suppressed. Contamination with carbonate likewise reduces the proportion of the superconducting phase. Up to now, the absolutely necessary use of quartz ampoules and gold foils in particular makes the production of relatively large ceramic components or amounts of powder uneconomical or even impossible in industry.

It is therefore an object of the invention to provide a process for producing ceramic parts and powder of thallium-containing high-$T_c$ superconductors (Tl-1223 and Tl-1122), in which minimal Tl losses can nevertheless be realised without use of quartz ampoules or containers closed with gold foil, so as to make the principle advantage of higher transition temperatures and better current capacity (at T>77K) of the thallium-containing superconductors industrially utilizable.

The object is achieved according to the present invention by a process of the generic type for producing high-$T_c$ superconductors containing thallium, calcium, barium and copper, possibly also lead and/or strontium, in which process a thallium-free precursor is produced in a first reaction step from a stoichiometric mixture of compounds of the metals Ba, Ca and Cu, possibly also Pb and/or Sr, having the metal content in the numerical ratio of atoms desired in the particular case, and in which the thallium-free precursor is then triturated with $Tl_2O_3$ and, if desired, is shaped to give a shaped part, wherein the precursor triturated with $Tl_2O_3$ is oxidatively fired in a flowing gas atmosphere.

The superconductor ceramic is formed during the firing in a solid state reaction from an oxide mixture essentially containing thallium, possibly also lead, calcium, barium and copper and having the approximate nominal composition $Tl/PbCa_2Ba_2Cu_3O_{8.5+x}$ (abbreviated as Tl-1223) or $Tl/PbCaBa_2Cu_2O_{6.5+y}$ (abbreviated as Tl-1122).

In the process of the present invention, a thallium-free precursor, a precalcined intimate mixture of alkaline earth metal oxocuprates, is produced in a first reaction step. For this purpose, the mixture of the metal compounds is preferably mechanically triturated, subsequently heated to temperatures in the range from 700° to 950° C. and heat treated for a period of at least 3 hours, preferably from 8 to 12 hours.

The mixture is then cooled to ambient temperature, again ground and subsequently heat treated in a stream of pure oxygen at temperatures of from 400° to 500° C. The risk of contamination of the reaction product by carbonate residues can, according to the present invention, be substantially reduced by the use of alkaline earth metal hydroxides in place of the customary carbonates. Commercially available products such as $Ba(OH)_2 \times 8\ H_2O$ and $Sr(OH)_2 \times 8\ H_2O$ can, if necessary, be purified sufficiently by recrystallization for only carbonate residues from the $Ca(OH)_2$ weighed out to be able to remain.

When using the hydroxides, the major part of the water of crystallization is removed on heating the mixture of the alkaline earth metal hydroxides and the copper oxide, and also possibly the lead oxide or lead nitrate, having the metal content in the numerical ratio of atoms desired in each case, preferably in a drying oven, at temperatures of at least 130° C., in particular at 150° C., over a period of at least 1 hour, preferably at least 2 hours. This can result in partial melting in the water of crystallization. Since this melt is very aggressive, chemically inert vessels, advantageously of polytetrafluoroethylene, are used here as evaporating dishes. To completely drive off the water of crystallization, this is followed by a further drying process in a corundum crucible in an electric muffle furnace at a temperature of 400° C., preferably 420° C., for a period of from 1 to 3 hours. Under these conditions, the degradation ends approximately at the stage of the monohydrates $Ba(OH)_2 \times H_2O$ or $Sr(OH)_2 \times H_2O$, which can be checked by means of thermoanalytical measurements. The mixture, after being triturated in an agate mortar, is then heated to temperatures in the range from 700° to 950° C. and heat treated over a period of at least 3 hours, preferably from 8 to 12 hours, with a sintered oxide mixture of alkaline earth metal oxocuprates being formed. The remaining water is given off only above 400° C. or 600° C.

The finished precursor is obtained after grinding and subsequent heat treatment at a temperature T of $400°\ C.\leq T \leq 500°\ C.$ in a stream of pure oxygen.

In a second step, the precursor thus prepared is triturated with the desired amount of $Tl_2O_3$ and, if desired, pressed to form the respective shaped bodies.

The subsequent firing process is carried out, according to the present invention, in a mobile tube furnace (electric resistance furnace) in a flowing, oxidizing gas atmosphere at a flow rate of $\geq 3$ l/hr and at a heating rate of at least 30K/min, preferably 60K/min. The gas used is preferably air or pure oxygen. To enable better checking of the temperature, the tube furnace can be specially equipped with an additional thermocouple.

FIG. 1 shows a longitudinal cross section through a furnace 13 suitable for the process of the present invention. Reference numerals indicate an outer quartz tube 1 and an inner quartz tube 2 which are both arranged in a tubular tunnel 3 which is surrounded on all sides by the electric heat elements 4. In addition, the furnace 13 possesses a first outer thermocouple 5 and a second inner thermocouple 6. In the interior of the inner quartz tube 2 there is arranged a boat 7 containing the sample 8. During the first heating phase, the first outer thermo-couple 5, which is part of the standard equipment, measures the temperature in the vicinity of the heating winding 4 and at the same time serves for the regulation of the furnace temperature. The second thermocouple 6 is conducted through a central capillary 9 in a ground glass cap 10 and through a protective tube 11 of laboratory glass. The protective tube 11 is connected to the glass capillary 9 by a connection piece 12 which preferably consists of polytetrafluoroethylene. The furnace 13 is fitted with a thermal insulation 14 which is provided with an outer jacket 15. The outer thermocouple 5 is surrounded by a protective tube 16.

The second thermocouple thus makes it possible to measure the temperature in the interior of the sample chamber in the direct vicinity of the sample. By means of a selection switch, temperature regulation can also be carried out when desired by means of this measuring point.

The actual solid state reaction takes place at the firing temperatures. According to the present invention, the sample chamber consists of a longer, outer tube, preferably of quartz glass, having ground glass cones and an inner protective tube. The dimensions depend in each case on the size and amount of the superconductor ceramic to be produced. The resistance tube furnace itself is dimensioned such that it can just still be moved back and forth over the tube.

The firing temperature, i.e. the temperature at which the solid state reaction leading to the superconducting compound takes place, is in each case different for the different compositions. Thus, the abovementioned compounds having the nominal composition $Tl/PbCa_2Ba_2Cu_3O_{8.5+x}$ (abbreviated as Tl-1223) can be produced in a multistep firing process at temperatures of at least 900° C., preferably of at least 905° C.; in this process the firing temperature should be maintained for a time of at most 30 minutes, preferably at most 20 minutes. Other compounds having the nominal composition $Tl/PbCaBa_2Cu_2O_{6.5+y}$ (abbreviated as Tl-1122) are formed at firing temperatures of only from 760° to 790° C. if this temperature is held for a time of at least 3 hours. The actual firing process is advantageously followed by an additional further thermal treatment at or above 700° C. for a time of at least 5 hours, preferably from 8 to 16 hours.

For the firing process of the present invention, the sample is first heated at a rate of at least 6K/min to a temperature of 500° C. and is heat treated for a period of from 8 to 12 hours in a flowing gas atmosphere at a flow rate in the range from 3 to 30 l/h. In the case of the Tl-1223 compound, the furnace is then again pushed away from the part of the tube containing the sample and is preheated to a temperature of at least 1000° C. The first outer thermocouple is adjacent to the heating winding and provides the thermal voltage for the temperature regulator. The gas stream which flows through the sample chamber, preferably pure oxygen, is again checked and, if necessary, adjusted so that a good gas flow exists around the sample. The latter is dependent on the dimensions of the sample chamber, preference being given to a flow rate in the range from 10 to 30 l/h.

After reaching the final temperature, the furnace is moved over the part of the tube containing the boat and the green body to be fired. The furnace temperature then begins to fall. At a temperature of about 900° C., temperature measurement is switched over to the second inner thermocouple. Temperature monitoring and furnace regulation are from then on carried out via the second inner thermocouple. This indicates that the sample temperature is at first still below 800° C. After a short time, the preferred heating rate being 6K/min, the maximum temperature of $900°\ C.\leq T_{max}\leq 915°$ C., preferably 905° C., is reached. This results in formation of the abovementioned partial melt. It can be established by means of thermoanalysis that the weight loss of the sample per unit time is most pronounced in this process stage. After reaching the reaction temperature, the temperature is lowered again to from 710° to 720° C. at a rate of from 4 to 6K/min, preferably 6K/min. In this temperature range, the further treatment is carried out for a period of from 8 to 16 hours, preferably 12 hours, preferably in a pure oxygen atmosphere. The superconducting ceramic is obtained after removing the tube furnace from the part containing the sample during the cooling phase, which is as rapid as possible, to ambient temperature. The samples can still be significantly contaminated with unreacted oxocuprates.

Naturally, the proportion of $BaCuO_2$ shows up particularly in X-ray powder studies. The weight losses during firing are in the range between 3 and 15% by weight, typically 3% by weight. A further improvement in respect of the maximum achievable density of the superconductor can, according to the present invention, be achieved by means of two additional measures.

a.) The actual firing process including further treatment and cooling is repeated a number of times, preferably two or three times, but without the preignition at 500° C.

b.) The ceramic is reground once more, mixed with from 1 to 3% by weight of $Tl_2O_3$, possibly also only now with the lead oxide or $PbNO_3$, again pressed and, as mentioned above, fired. This may be followed by the procedure a.).

For the preparation of the superconductor of the type Tl-1122, it is also possible according to the present invention to use another variant of the firing process in which the maximum temperature is only 780° C. In this variant, the furnace does not have to be preheated. The lower firing temperature offers the advantage of weight losses which are only small. The firing process can take a number of hours at this temperature, without resulting in a practically significant change in the nominal composition weighed out due to weight decrease. The measures a.) and b.) can be omitted in this variant.

According to the present invention, a copper-rich starting mixture based on the idealized numerical ratio of atoms of the formulae $TlCa_2Ba_2Cu_3O_{8.5+x}$ and $TlCaBa_2Cu_2O_{6.5+y}$ respectively is used. The copper excess is in the range from 0.2 to 1.5 relative atomic mass units. An excess of calcium and a deficiency of barium are weighed out. The ratio of the numbers of atoms of Ca/Ba, or possibly Ca/Σ(Ba+Sr), is greater than 1.1 to above 1.23, preferably 1.2. The strontium addition is then from 0.1 to 0.2 relative atomic masses, but not in the case of the compounds of the type $Tl_{0.5}Pb_{0.5}Ca_{1-n}(Ba/Sr)_2Cu_nO_z$ if a large part of the Ba is here replaced by Sr. A typical example is given by the formula $TlCa_{2.09}Ba_{1.73}Sr_{0.18}Cu_{3.44}O_x$. Standardized to 3 copper atoms, this is then $Tl_{0.87}Ca_{1.82}Ba_{1.51}Sr_{0.16}Cr_3O_{8.5+x}$. If lead is to be added to stabilize the Tl-1223 phase, the proportion is from 0.05 to 3% by weight, calculated as lead oxide. When weighing out the starting materials for producing the compound of the type Tl-1122, with the reduced calcium or copper content, the corresponding calcium or copper excess is analogously taken into account (e.g. $Tl_{0.8}Ca_{1.2}Ba_2Cu_2O_z$ instead of $TlCaBa_2Cu_2O_z$).

The process of the present invention is particularly suitable for producing sintered bodies of a wide variety of dimensions, depending on the dimensions selected for the tube furnace used. The critical transition temperatures are in the range $105K \leq T_c \leq 116K$ for Tl-1223, and in the range $93K \leq T_c \leq 105K$ for Tl-1122. The sintered bodies can have contacts applied to them in a downstream process, by smoothing the surface (grinding or polishing) and subsequent etching and sputtering on of silver. After firing on, for example, a silver layer at T=500° C. (in $O_2$), contacts suitable for power applications and having contact resistances of $R=10$ $\mu\Omega$ are obtained. Crystal powders as precursors for the OPIT method can be produced by grinding the reacted compacts.

In the following examples, the invention is further clarified to those skilled in the art without being restricted to the concrete embodiments described.

EXAMPLE 1

63.07 parts by weight of $Ba(OH)_2 \times 8$ $H_2O$, 16.28 parts by weight of $Ca(OH)_2$ and 23.87 parts by weight of CuO were weighed out, mixed and first heated in a drying oven for a time of 3 hours at a temperature of 150° C. The mixture was then triturated in an agate mortar and heated in a muffle furnace in a corundum crucible first for a time of 3 hours at a temperature of 420° C. and then held for a further 3 hours at from 600° to 650° C. After cooling, the mixture was again triturated well. The metal oxide mixture obtained was then heated in a muffle furnace in air to a temperature of from 900° to 950° C. and heat treated for a period of 10 hours. The sintered mixture of various oxocuprates was ground in a mortar and heat treated in a pure oxygen atmosphere for 1 hour at temperatures in the range from 400° to 450° C. 18.27 parts by weight of $Tl_2O_3$ were then weighed out and added, the oxide mixture was mixed in an agate ball mill with a little petroleum spirit (boiling range from 60° to 90° C.) to form a thin slurry and was ground for at least one hour. After evaporation of the petroleum spirit, the oxide powder was pressed into 1.2 mm thick pellets ($\phi$=8 mm, pressing pressure >40 kN). The green bodies thus produced were first ignited at a temperature of 500° C. in a corundum boat in a pure $O_2$ atmosphere for a period of 12 hours and then heated as quickly as possible to 905° C. (firing temperature). The temperature was here raised from 800° to 905° C. within 12 minutes. After reaching the final temperature, temperature measurement and regulation were carried out by means of the second inner thermocouple. Cooling was carried out at a rate of 6K/min to a temperature of from 710° to 720° C. and finally after a further 10.5 hours as quickly as possible to ambient temperature. It was established by thermoanalysis that a mass loss of about 2.5% by weight occurred during the second heating phase in the temperature range above 500° C.

The transition temperature was measured on the shaped part produced in this way:

a) AC susceptometer $T_c$=120K (intrinsic).

b) DC measurement $T_c$=111K (downset).

EXAMPLE 2

Corresponding to the formula $Tl_{0.8}Ca_{2.2}Ba_{1.9}Sr_{0.1}Cu_3O_{8.8+x}$, 32.15 parts by weight of $Ba(OH)_2 8$ $H_2O$, 8.74 parts by weight of $Ca(OH)_2$, 1.43 parts by weight of $Sr(OH)_2 8$ $H_2O$ and 12.8 parts by weight of CuO were weighed out, mixed and first pretreated as in Example 1. 9.8 parts by weight of $Tl_2O_3$ were then added and pellets were pressed as in Example 1. The reaction of the pellets was carried out in a similar manner to that described above in Example 1. The mass loss determined by thermoanalysis (DTA/TG measurement) during the second heating phase, above 500° C., was 2.9% by weight.

Measurement of the transition temperature on the shaped parts from Example 2 gave the following result:

a) AC susceptometer $T_c$=119K (intrinsic).

b) DC measurement $T_c$=114K (downset).

EXAMPLE 3

Corresponding to the formula $Tl_{0.69}Pb_{0.025}Ca_{2.2}Ba_{1.78}Sr_{0.1}Cu_3O_{8.5+x}$, 16.28 parts by weight of $Ca(OH)_{2,}$ 56.1 parts by weight of $Ba(OH)_2 8$ $H_2O$, 2.6 parts by weight of $Sr(OH)_2 8\ H_2O$ and 23.9 parts by weight of CuO were weighed out and treated as in Example 1. After ignition for three hours at from 600° to 650° C., 0.67 parts by weight of lead were added as $Pb(NO_3)_2$ to the still thallium-free oxocuprate mixture. Further processing is carried out as described in Example 1. 18.26 parts by weight of $Tl_2O_3$ were added to the oxide mixture heat treated at 950° C. and the resultant mixture was ground in a ball mill as in Example 1. The oxide powder from the ball mill was pressed into a number of larger pellets having a thickness of 3.5 mm and a diameter of 20 mm (pressing pressure 100 kN). The first reaction step to give the superconductor was as in Example 1. In a second step, the pellets were again ground up, 3% by weight of PbO were added and the mixture was ground in a ball mill for 1 hour. For the second firing process, the mobile furnace was preheated beforehand to 1000° C. and only then pushed over the part of the tube containing the corundum boat and the sample. From then on temperature control and regulation were carried out by means of the inner thermocouple. The final temperature (about 905° C.) was held for a further 10 minutes. Pure oxygen flowed through the sample chamber, with the flow rate being set to 5 l/h. The cooling phase corresponded to that of Example 1.

Result a) AC susceptometer curve after step 1→$T_c$=95K.

b) AC susceptometer curve after step 2→$T_c$=110K.

EXAMPLE 4

The oxide mixture of the nominal composition $Tl_{0.8}Ca_{2.2}Ba_{1.9}Sr_{0.1}Cu_3O_{8.5+x}$ produced as in Example 2, was pressed into larger pellets and fired as described in Example 3. For the second reaction step, the sample which had been again ground up in the ball mill was pressed into bars (approximate dimensions 5×5×40 mm, 16 kN). The second firing process corresponded to that of Example 3 with a further ignition process (time: 12 hours) in the temperature range from 712° to 720° C. ($O_2$ stream: 5 l/h). This second firing process was repeated again. The bar had then shrunk by about 10% to a length of 36.5 mm. The density calculated from the dimensions and the mass was 4.3 g/cm³. It was split in the longitudinal direction by means of a metal saw and ground to the dimensions 2.5×2.5×36 mm using a grinding disc ®ECOMET 2 (from Buehler Ltd.). Silver contacts (layer thickness from 60 to 80 mm) were then applied in a ®SPUTTER COATER S150B (from EDWARDS) and fired at 500° C. for 20 minutes in an oxygen atmosphere.

Result a) $T_c$=118K (AC curve and SQUID).

b) According to X-ray powder data, the sample contained primarily Tl-1223, $BaCuO_2$, a little Tl-1122 and $Ca_2CuO_3$ and no Tl-2223.

c) Volume fraction of superconductor 43% by volume (from powder measurement—SQUID—estimation).

d) Zero-field critical current density: $J_c$=460 A/cm².

To measure the critical current density, the test specimen men was measured using the customary four-point method. For this purpose, a bar was clamped in a heavy current generator designed for a current of 500 A. The current was fed in via the outer ends of the bar and the voltage was measured at two contacts 3 cm apart on the rod. The critical current density is calculated from the current which causes a voltage drop of exactly 1 μV/cm.

EXAMPLE 5

A sample having the nominal composition $Tl_{0.8}Ca_{1.2}Ba_2Cu_2O_{6.5+x}$ was weighed out from the mixture of oxocuprates precalcined as in Example 1 and $Tl_2O_3$. The pellets having a diameter of 8 mm were first precalcined for 8 hours at 500° C. in a stream of pure oxygen. The temperature was then increased at a rate of 6K/min to 780° C. and held for 5 hours. This was followed by a heat treatment process at 710° C. for a time of 12 hours.

Result a) $T_c$=93K (AC curve and SQUID).

b) According to measurements using the SQUID magnetometer, the sample additionally contained a second superconducting phase having a $T_c$ of 60K (presumably Tl-1021).

We claim:

1. A process for producing high-$T_c$ superconductors containing thallium, calcium, barium and copper, and optionally lead and/or strontium, comprising preparing a thallium-free precursor in a first reaction step by mechanically triturating a mixture of compounds of the metals Ba, Ca and Cu, and optionally Pb and/or Sr, having a metal content in the numerical ratio of atoms desired in the particular case, heating the mixture to temperatures in the range from 700° to 950° C. and heat treating the mixture for a period of at least 3 hours, and then, optionally cooling the mixture to ambient temperature, grinding the mixture and subsequently heat treating the mixture at temperatures of from 400° to 500° C. in a stream of pure oxygen, said first reaction step being conducted using alkaline earth metal hydroxides, and tritrating the precursor with $Tl_2O_3$ optionally, shaping the precursor into a shaped part, and oxidatively firing the precursor triturated with $Tl_2O_3$ in a flowing gas atmosphere.

2. The process as claimed in claim 1, wherein the oxidative firing of the triturated $Tl_2O_3$/precursor is carried out in a mobile tube furnace in a flowing, oxidizing gas atmosphere at a flow rate of>3 l/h and at a heating rate of at least 30 K/min.

3. The process as claimed in claim 2, wherein the gas used is air or pure oxygen.

4. The process as claimed in claim 1, wherein prior to mechanical trituration in the first reaction step, a mixture of $Ba(OH)_2 \times 8\ H_2O$, $Ca(OH)_2$ and copper oxide, and optionally lead oxide or lead nitrate and/or $Sr(OH)_2 \times 8\ H_2O$, having a metal content in the numerical ratio of atoms desired in each case, is heated at temperatures of at least 130° C. for a period of at least 1 hour and wherein a second drying process is then carried out at at least 400° C. for a period of from 1 to 3 hours.

5. The process as claimed in claim 1, wherein compounds having the nominal composition $Tl/PbCa_2Ba_2CuO_{8.5+x}$ are heated during oxidative firing of the triturated $Tl_2O_3$/precursor at temperatures of at least 900° C. with the firing temperature being maintained for a time of at most 30 minutes.

6. The process as claimed in claim 1, wherein compounds having the nominal composition $Tl/PbCaBa_2Cu_2O_{6.5+y}$ are heated during oxidative firing of the triturated $Tl_2O_3$/precursor at temperatures of from 760° to 790° C., with this temperature being held for a time of at least 3 hours.

7. The process as claimed in claim 1, wherein the oxidative firing of the triturated $Tl_2O_3$/precursor is followed by an additional further heat treatment at above 700° C. for a time of at least 5 hours.

8. The process as claimed in claim 1, wherein the oxidative firing of the triturated $Tl_2O_3$/precursor including heat treatment and cooling is repeated a number of times.

9. The process as claimed in claim 1, wherein subsequent to oxidative firing of the triturated $Tl_2O_3$/precursor, the material is ground once more, mixed with from 1 to 3% by weight of $Tl_2O_3$, and optionally mixed with lead oxide or $PbNO_3$, pressed and fired again.

10. The method of claim 1, further comprising smoothing the surface of the formed high-Tc superconductor, and subsequently etching and sputtering silver on said surface.

11. A process as claimed in claim 1, wherein said superconductor prepared has minimal thallium loss without the use of quartz ampoules or gold foils.

12. A process as claimed in claim 2, wherein said heating rate is at least 60 K/min.

13. A process as claimed in claim 5, wherein said oxidative firing of the triturated $Tl_2O_3$/precursor is conducted at a temperature of at least 905° C., with the firing temperature being maintained for a time of at most 20 minutes.

14. A process as claimed in claim 7, wherein said additional further heat treatment is at above 700° C. for a time of from 8 to 16 hours.

15. A process as claimed in claim 8, wherein said oxidative firing of the triturated $Tl_2O_3$/precursor is repeated two to three times.

16. A process as claimed in claim 1, wherein prior to mechanical trituration in the first reaction step, a mixture of the alkaline earth metal hydroxides is heated at a temperature of at least 130° C. for a period of at least 1 hour.

17. A process for producing high-$T_c$ superconductors containing thallium, calcium, barium and copper, and optionally lead and/or strontium, comprising preparing a thallium-free precursor in a first reaction step employing compounds having the nominal composition $Tl/PbCaBa_2Cu_2O_{6.5+y}$ that are fired at firing temperatures of from 760° to 790° C., with this temperature being held for a time of at least 3 hours, titrating the precursor with $Tl_2O_3$ optionally, shaping the precursor into a shaped part, and oxidatively firing the precursor triturated with $Tl_2O_3$ in a flowing gas atmosphere.

* * * * *

UNITED STATES PATENT AND TRADEMARK OFFICE
CERTIFICATE OF CORRECTION

PATENT NO. : 5,801,126
DATED : September 1, 1998
INVENTOR(S) : Marc NEUBACHER et al.

It is certified that error appears in the above-identified patent and that said Letters Patent is hereby corrected as shown below:

Title page, item [54], and col. 1, line 1, Title of Invention contains a typographical error wherein "PRORDUCING" should read --PRODUCING--. Item [75] Inventor, prename of fifth inventor should read --Prof. Hanskarl Müller-Buschbaum--.

Signed and Sealed this

Twenty-eighth Day of September, 1999

Attest:

Q. TODD DICKINSON

*Attesting Officer*          *Acting Commissioner of Patents and Trademarks*

UNITED STATES PATENT AND TRADEMARK OFFICE
CERTIFICATE OF CORRECTION

PATENT NO. : 5,801,126
DATED : September 1, 1998
INVENTOR(S) : Marc NEUBACHER, et al.

It is certified that error appears in the above-identified patent and that said Letters Patent is hereby corrected as shown below:

Column 1, line 43, delete "abovementioned" and insert –above-mentioned;

Column 7, line 44, delete "mm" and insert --$\mu$m--.

Signed and Sealed this

Thirtieth Day of November, 1999

Attest:

Attesting Officer

Q. TODD DICKINSON

Acting Commissioner of Patents and Trademarks